United States Patent [19]

Yoshida et al.

[11] 4,199,357

[45] Apr. 22, 1980

[54] COMPOSITIONS FOR RECORDING MATERIALS

[75] Inventors: Satoshi Yoshida; Yuzo Mizobuchi; Tomoaki Ikeda; Toshio Iijima, all of Saitama, Japan

[73] Assignee: Fuji Photo Film Co., Ltd., Minami-Ashigara, Japan

[21] Appl. No.: 869,963

[22] Filed: Jan. 16, 1978

Related U.S. Application Data

[63] Continuation of Ser. No. 637,430, Dec. 3, 1975, abandoned.

[30] Foreign Application Priority Data

Dec. 3, 1974 [JP] Japan ................................ 49-139841

[51] Int. Cl.[2] ............................ G03F 7/02; G03C 1/00

[52] U.S. Cl. .................................... 430/270; 101/465; 430/495; 430/644

[58] Field of Search ........................ 96/88, 33, 1.5, 67, 96/480 P; 252/501; 75/134 D, 134 H, 134 G; 346/134; 101/465

[56] References Cited

U.S. PATENT DOCUMENTS

| | | | |
|---|---|---|---|
| 1,316,220 | 9/1919 | Case | 75/134 D |
| 2,837,618 | 6/1958 | Gildart | 75/134 D |
| 3,707,372 | 12/1972 | Hallman et al. | 96/33 |
| 3,843,394 | 10/1974 | Katayama et al. | 96/88 |
| 3,941,591 | 3/1976 | Hanada et al. | 96/1.5 |
| 3,996,057 | 12/1976 | Kawaziri et al. | 96/88 |

*Primary Examiner*—Won H. Louie, Jr.

*Attorney, Agent, or Firm*—Sughrue, Rothwell, Mion, Zinn and Macpeak

[57] ABSTRACT

A composition for a recording material comprising a bismuth-sulfur series material or a bismuth-germanium-sulfur series material.

12 Claims, 1 Drawing Figure

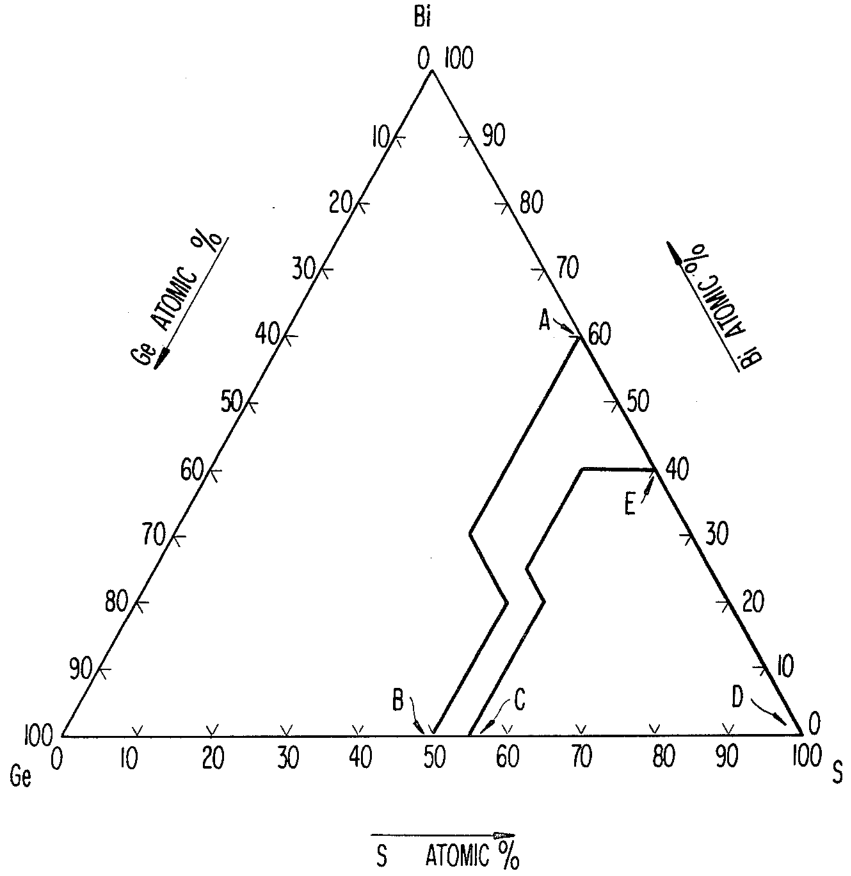
Bi
Ge ATOMIC %
Bi ATOMIC %
S ATOMIC %
Ge
S
A
B
C
D
E
0
10
20
30
40
50
60
70
80
90
100

COMPOSITIONS FOR RECORDING MATERIALS

This is a continuation of application Ser. No. 637,430, filed Dec. 3, 1975.

BACKGROUND OF THE INVENTION

1. Field of the Invention

This invention relates to a light-sensitive recording material which basically comprises a non-silver light-sensitive compound, more particularly, to a light-sensitive composition for a light-sensitive recording material.

2. Description of the Prior Art

A large number of studies have hitherto been made on light-sensitive recording systems using chalcogen compounds which consisting mainly of one or more elements selected from sulfur, selenium and tellurium. For example, Japanese Patent Publication 6,142/72 discloses a recording system which uses a light-sensitive recording material having, as a basic constituent, laminated layers comprising a layer of a chalcogen compound and a layer of a metal and which forms a latent image capable of being developed and intensified by physical development after exposure to light through an image.

Moreover, there is known a method employing a semi-conductive sulfide such as lead sulfide and forming an image by etching which is effected by taking advantage of the difference in solubility in an electrolytic solution between exposed areas and unexposed areas, as described in *Soviet Physics Semiconductors*, Vol. 7, p. 136 (1973).

In addition, recording materials for holograms have been studied which take advantage of differences in the light absorption between irradiated areas and unirradiated areas that result from laser ray irradiation of a thin film of arsenic sulfide, as described in *Applied Physics Letters*, Vol. 19, p. 205 (1971).

In particular, many studies have been made on light-sensitive materials which make use of the photodoping phenomenon, i.e., materials which have, as a basic constituent, a layer of a chalcogen composition and a metallic layer and which form an image upon light irradiation, i.e., it is known that when a light-sensitive recording material comprising laminated layers composed of a chalcogen composition layer and a metallic layer are subjected to appropriate irradiation, a mutual diffusion (photodoping) is caused between both of the layers at irradiated areas to form a mutual diffusion product, thus yielding an image corresponding to the light irradiation pattern, as described in *Soviet Physics Solid State*, Vol. 8, p. 451 (1966), Japanese Patent Application Laid-Open 5,324/74, U.S. Pat. Nos. 3,637,377 to 3,637,381 and 3,637,383.

The above light-sensitive recording materials have been used for the preparation of photomasks for integrated circuit manufacture, printed circuit board manufacture and the like, since the images obtained generally have excellent resolution (high resolving power) and transmit some visible rays, so that registration is easily done. Moreover, it has been proposed to use these materials for slides, as light-sensitive materials for microphotography, as light-sensitive materials for holograms and other uses.

In addition, it is possible to clarify an image formed by the above process by selectively attaching a printing ink to the above light-sensitive recording material by taking advantage of the difference in wettability between exposed areas and unexposed areas on the surface thereof. It is also possible to transfer the attached printing ink to a paper and the like. Therefore, such light-sensitive recording materials can also be used as printing plates. Furthermore, the application of light-sensitive recording materials which make use of photodoping in a wide range is probable since development is unnecessary, fixing is not necessarily required, they can be handled in the light, and have excellent resolution.

Chalcogen compositions comprising light-sensitive recording materials of the prior art as described above mainly comprise a chalcogen glass containing arsenic as a primary component. That is, most of them are mainly composed of an arsenic-sulfur series glass, an arsenic-selenium series glass or an arsenic-sulfur-tellurium series glass. Light-sensitive materials using such chalcogen glasses are disadvantageous in that their photosensitivity is low, and therefore, long-time exposure is required in order to obtain a clear image using a high-pressure mercury lamp. Moreover, they have another disadvantage in that their toxicity is considerable because of the presence of arsenic as a main component, which hinders their practical use.

Recently, studies to eliminate the aforesaid defects have been made. For example, the use of a chalcogen glass comprising germanium-sulfur has been proposed, as described in Japanese Patent Application Laid-Open 71,626/73. This series is quite different in the absence of arsenic from the chalcogen glasses described hereinbefore.

However, according to research by the present inventors, it has been found that while light-sensitive recording materials using a germanium-sulfur series glass are excellent in showing no toxicity, they suffer the disadvantage that sensitivity is relatively low, and therefore, long-time exposure is required, making their practical use difficult.

SUMMARY OF THE INVENTION

One object of this invention is to remove the aforesaid defects of the prior art.

Another object of this invention is to provide a light-sensitive material of improved photosensitivity.

A further object of this invention is to provide a light-sensitive recording material which is non-toxic.

This invention provides a light-sensitive recording material comprising a chalcogen material, i.e., a composition containing a bismuth-sulfur series material as a main component or a composition containing a bismuth-germanium-sulfur series material as a main component in a chalcogen comprising layer. In particular, the use of bismuth enables the objects of the invention to be achieved.

BRIEF DESCRIPTION OF THE ACCOMPANYING DRAWING

The FIGURE is a ternary phase diagram of the bismuth-germanium-sulfur system.

DETAILED DESCRIPTION OF THE INVENTION

The compositions used in the present invention include not only a uniform amorphous material (an amorphous material is a material having an irregular structure with respect to the disposition of the constituent atoms thereof which provides no crystalline pattern upon X-ray diffraction analysis) but also an amorphous material containing a crystalline material (a crystalline material is a material having a regular structure with respect to the disposition of the constituent atoms thereof which provides a crystalline pattern upon X-ray diffraction analysis) deposited therein, a crystalline material per se and a mixture of an amorphous material and a crystalline material The compositions of the present invention contain at least about 40 atomic % sulfur and less than about 60 atomic % Bi. The composition containing a bismuth-sulfur series material as a main component may contain, in addition to bismuth and sulfur as main components, up to about 10 atomic % of a third component (other than Ge, as in such case one has a Bi-S-Ge system). Also, the composition containing a bismuth-germanium-sulfur series material as a main component may contain, in addition to bismuth, germanium and sulfur as main components, up to about 10 atomic % of a fourth component. The third component or the fourth component can be selected without restriction due to the relatively low percentages thereof, and can be selected from metallic, semi-metallic or non-metallic element such as selenium, tellurium, oxygen, phosphorus, sodium, potassium, silicon, tin, lead, zinc, iodine, copper, silver, gallium, indium, thallium, arsenic, antimony, mixtures thereof and the like.

Specific examples of such compositions are those shown by the following general formula:

$$Bi_XGe_YS_ZM_A$$

($X+Y+Z=100$, Y being 0 when a Bi-S system is involved, $A \leq 10$). In this formula, M represents at least one component other than Bi, Ge and S.

The bismuth-sulfur series material or the bismuth-germanium-sulfur series material can be prepared in a conventional manner. For example, the bismuth-germanium-sulfur series material can be obtained by weighing bismuth, germanium and sulfur as starting materials in a predetermined atomic ratio, sealing them in a quartz container under a vacuum of about $10^{-5}$ Torr, melting them by heating at about 500° to about 1,000° C., maintaining them at that temperature for a long time with stirring to render the melt uniform, e.g., on the order of 3 to 20 hours, and then quenching by putting the quartz container in water or by air-cooling. In place of elements such as bismuth, germanium and sulfur, sulfides of bismuth, sulfides of germanium and the like can, of course, be used as starting materials. When a third or fourth component is present, they are also added in a predetermined ratio in a similar form.

The bismuth-sulfur series compositions and bismuth-germanium-sulfur series compositions of this invention, which include those represented by the aforesaid general formula, will now be described in more detail.

Referring to the FIGURE, a sufficient effect is observed with compositions which fall within the area bounded by the curve joining the points A, B, C, D, E and A, or lies on the line joining the points D, E, A and B. The present invention does not include compositions represented by the straight line joining the points B, C and D as they lack Bi. Particularly preferred results are obtained with a composition which falls within the area bounded by the line joining the points C, D, E and C or lies on the line joining the points D, E and C. The present invention does not include compositions represented by the straight line joining the points C and D.

Some of the aforesaid M components may get mixed in the composition, even if they are not added purposely, depending upon the container used for the preparation of the composition, the material of the stirring means, the reaction conditions, etc. For example, a small amount of silicon or silicon oxide may be incorporated from a quartz container into the composition.

Using the aforesaid composition, a light-sensitive recording material can be prepared, for example, by coating or forming a layer of the composition on a metallic layer. As metals for the metallic layer, one or more of silver, cooper, lead, zinc, cadmium and others can be employed. Of these metals, silver, copper and the like are most advantageously used.

In using the bismuth-sulfur series composition or bismuth-germanium-sulfur series composition of this invention for a light-sensitive recording material, the light-sensitive recording material has a structure, depending on the end-use, of a monolayer of the bismuth-sulfur series composition or the bismuth-germanium-sulfur series composition, or of laminated layers comprising a layer of the bismuth-sulfur series composition or the bismuth-germanium-sulfur series composition and a metallic layer. The layer of the bismuth-sulfur series composition or the layer of the bismuth-germanium-sulfur series composition used has an average film thickness of about 25 Å to about 1,000μ, particularly about 100 Å to about 3,000 Å. The metallic layer used has an average film thickness of about 10 Å to about 10μ, particularly about 50 Å to about 500 Å.

Regarding the structure of the laminated layers comprising the chalcogen-containing layer and the metallic layer, the relative thicknesses of both layers are not particularly restricted, so long as they permit light irradiation to cause a photodoping phenomenon at the interface between the chalcogen composition layer and the metallic layer. Thus, when one of the two layers is made of a transparent material, the thicknesses thereof are restricted from the viewpoint of practical use rather than by any criticality being attached to the layer thickness per se. For example, with thicker layers, more light exposure to cause photodoping at the interface between the chalcogen composition layer and the metallic layer is required due to light absorption of the thicker layers.

In providing a layer structure, methods such as vacuum evaporation, sputtering, ion-plating, spraying, dipping and extrusion can be advantageously used to form both layers. For example, a support is placed in a vacuum evaporation apparatus wherein a Bi-Ge-S series material in an alumina coated tungsten basket is vacuum evaporated onto the support at $5 \times 10^{-5}$ Torr by applying an electric current to the basket to heat and evaporate the Bi-Ge-S series material, whereafter Ag is vacuum evaporated onto the resulting plate in the same manner as for the vacuum evaporation of the Bi-Ge-S series material to form a "laminated" structure.

A light-sensitive recording material having the aforesaid layer structure does not require a support if the film thickness of the layers provides sufficient strength for handling. However, transparent or opaque supports can be used, if desired, and such is generally more convenient for ease of handling.

There are no limitations of substance on the support which will not be apparent to one skilled in the art, e.g., it must not degrade if a high temperature deposition is used, and useful supports include a glass sheet, polyester film, metallic sheet, paper, and the like. In providing the laminated-layer structure for a light-sensitive recording material on the support, the metallic layer may be the upper layer or the lower layer.

The light-sensitive recording material thus obtained is subjected to irradiation with electromagnetic waves or particle rays so as to cause a photolysis reaction or photo-doping, thus forming an image corresponding to the irradiated areas.

The light source used includes mercury lamps, tungsten lamps, sunlight, xenon lamps, flash lamps, carbon arc lamps, electron rays, and the like, with a mercury lamp of 250 w to 1 kw being most conveniently used.

The irradiation time can vary widely depending upon the intensity of the light source, the wavelength, the distance from the light source, the thickness of the layer, etc., but about 1 sec to about 60 min, particularly about 1 min to about 10 min, is sufficient.

Before, during or after light irradiation, the temperature may be kept at about $-20°$ C. to about 150° C., and particularly, heating may be effected to about 20° C. to about 100° C.

In the foregoing, a light-sensitive recording material having, as basic constituents, laminated layers comprising a chalcogen material layer and a metallic layer has been described in detail, but the application of the compositions of this invention is not limited only to such light-sensitive recording materials. The composition of this invention can be used for a light-sensitive material comprising a metallic sheet, an organic film base, a paper or the like having thereon the composition layer, or, if desired, a composition layer in which a metal as earlier exemplified is mixed (typically, when the thickness of the metal layer is less than about 100 Å, the metal does not exist as a continuous film upon microscopic analysis but assumes an island-like structure mixed in the chalcogen composition layer), or, if desired, the composition layer can be laminated to the metallic layer, which light-sensitive material exhibits a wettability difference to a liquid, i.e., a liquid which adheres to exposed areas of the surface but which does not adhere to unexposed areas after image-wise exposure, or a liquid which does not adhere to exposed areas but which adheres to unexposed areas, e.g., a conventional printing ink. If such liquids contain an ink, it can be directly viewed on the surface. Moreover, the ink may be directly transferred to a paper, or the like, by conventional printing techniques.

As described above, the bismuth-sulfur series material and the bismuth-germanium-sulfur series material of this invention are suitable as a chalcogen compositions used for the aforesaid light-sensitive recording materials. Furthermore, the materials or compositions of this invention have the advantage of being non-toxic.

This invention will now be illustrated in more detail by the following non-limiting examples.

EXAMPLE 1

Bismuth, germanium and sulfur were mixed in a gram atom ratio of 30:10:60, and then the mixture was sealed in a quartz container under a vacuum of about $10^{-5}$ Torr and melted at a temperature of 900° C. for about 15 hours while stirring by rocking the quartz container. Thereafter, the quartz container was put into water to quench the system, thus obtaining a composition represented by $Bi_{30}Ge_{10}S_{60}$. X-ray analysis showed that the $Bi_{30}Ge_{10}S_{60}$ composition was a mixture primarily comprising an amorphous material and a small amount of a crystalline material represented by $Bi_2S_3$. The composition was vacuum evaporated onto a polyester film, i.e., the $Bi_{30}Ge_{10}S_{60}$ composition was placed in an alumina coated tungsten basket in a vacuum evaporation apparatus at $5\times10^{-5}$ Torr, the composition was heated by applying electric current to the tungsten basket and vacuum evaporated to a 1,500 Å thickness onto the polyester film (100μ thick) in the apparatus, measuring the thickness of the $Bi_{30}Ge_{10}S_{60}$ composition layer formed with a thickness monitor. Ag was then vacuum evaporated to a 300 Å thickness onto the thus formed chalcogen composition layer in the same manner. This essential procedure was used in the following Examples except, of course, for changing the order of deposition in certain examples. A light-sensitive recording material was thus prepared. The light-sensitive recording material was exposed through the polyester film base to a 500 w tungsten lamp light source at a distance of about 30 cm through an image mask for 5 minutes. There was obtained a very satisfactory and clear image having excellent resolution.

EXAMPLE 2

A composition represented by $Bi_{30}Ge_{20}S_{50}$ was obtained in the same manner as in Example 1 except for mixing bismuth, germanium and sulfur in a gram atom ratio of 30:20:50 and melting the mixture at a temperature of 900° C. for 18 hours with stirring. X-ray analysis showed that the composition was a mixture primarily comprising an amorphous material, a small amount of crystalline $GeS_2$ and a small amount of Bi particles. Silver was vacuum evaporated on a polyester film to provide a film thickness of 300 Å and on this layer the $Bi_{30}Ge_{20}S_{50}$ composition was vacuum evaporated to provide a layer 1,000 Å thick, thus preparing a light-sensitive recording material. The recording material was exposed on the side of the chalcogen layer to a mercury lamp of 250 w at about a 30 cm distance through an image mask for 5 minutes. There was obtained a clear and very satisfactory image having excellent resolution.

EXAMPLE 3

A composition represented by $Bi_{10}Ge_{10}S_{80}$ was obtained in the same manner as in Example 1 except for mixing bismuth, germanium and sulfur in a gram atom ratio of 10:10:80. X-ray analysis showed that the composition was a uniform amorphous material. The composition was vacuum evaporated on a polyester film to form a layer 1,500 Å thick, and on the layer a silver layer 300 Å thick was vacuum evaporated, thus preparing a light-sensitive recording material. The recording material was exposed under the same conditions as in Example 1 to obtain a clear and very satisfactory image having excellent resolution.

EXAMPLE 4

A composition represented by $Bi_{25}S_{75}$ was obtained in the same manner as in Example 1 except for mixing bismuth and sulfur in a gram atom ratio of 25:75 and melting the mixture at 700° C. for 17 hours with stirring. Silver was vacuum evaporated on a polyester film to provide a layer 300 Å thick, and on the layer the $Bi_{25}S_{75}$ composition was vacuum evaporated to provide a film thickness of 1,000 Å, thus preparing a light-sensitive recording material. The recording material was exposed to a mercury lamp of 250 w at a distance of about 30 cm through an image mask for 3 minutes to obtain a clear and very satisfactory image having excellent resolution.

EXAMPLE 5

A composition represented by $Bi_5Ge_{25}S_{70}$ was obtained in the same manner as in Example 1 except for mixing bismuth, germanium and sulfur in a gram atom ratio of 5:25:70. X-ray analysis showed that the composition was a uniform amorphous material. The composition was vacuum evaporated on a polyester film to form a layer 1500 Å thick, and further on the layer a silver layer 300 Å thick was vacuum evaporated, thus preparing a light-sensitive recording material. The recording material was exposed under the same conditions as in Example 1 except for using an exposure time of 20 minutes to obtain a satisfactory image.

EXAMPLE 6

A composition represented by $Bi_5Ge_{45}S_{50}$ was obtained in the same manner as in Example 1 except for mixing bismuth, germanium and sulfur in a gram atom ratio of 5:45:50. A silver layer 300 Å thick was formed on a polyester film base and the composition of $Bi_5Ge_{45}S_{50}$ was vacuum evaporated thereon to provide a chalcogen layer 1,500 Å thick, thus preparing a light-sensitive recording material. The recording material was exposed under the same conditions as in Example 2 except for using an exposure time of 10 minutes to obtain a clear and satisfactory image.

EXAMPLE 7

A composition represented by $Bi_5Ge_{35}S_{60}$ was synthesized in the same manner as in Example 1 except for mixing bismuth, germanium and sulfur in a gram atom ratio of 5:35:60. The $Bi_5Ge_{35}S_{60}$ composition was vacuum evaporated on an aluminum plate to provide an average film thickness of 150 Å, and a silver layer having an average film thickness of 15 Å was provided thereon, thus preparing a light-sensitive recording material. The recording material was exposed to a mercury lamp light source through an image mask as in Example 4, and then a conventional off-set printing ink was applied to the recording material. The ink selectively adhered only to unexposed areas to provide a clear image. When the image was transferred to a paper, a satisfactory transferred image was obtained.

EXAMPLE 8

A composition represented by $Bi_{10}Ge_{30}S_{60}$ was synthesized in the same manner as in Example 1 except for mixing bismuth, germanium and sulfur in a gram atom ratio of 10:30:60. The composition was vacuum evaporated on an aluminum plate to provide an average film thickness of 150 Å, thus preparing a light-sensitive recording material. The recording material was exposed to a mercury lamp light source through an image mask as in Example 4, and then a printing ink was applied to the recording material. The ink selectively adhered only to the unexposed areas to provide a sharp image. When the image was transferred to a paper, a satisfactory transferred image was obtained.

As described above, the bismuth-sulfur series composition and the bismuth-germanium-sulfur series composition of this invention provide excellent light-sensitive recording materials which are non-toxic and which have higher photo-sensitivity as compared with recording materials using the conventional chalcogen compounds. Therefore, the light-sensitive material using the bismuth-sulfur series composition or the bismuth-germanium-sulfur series composition of this invention as a light-sensitive layer can be used for extensive purposes in addition to the aforesaid application, e.g., as a photomask for integrated circuit manufacture, printed circuit board manufacture, as a slide, as a photosensitive material for micro- or holographic printing plates, and the like.

While the invention has been described in detail and with reference to specific embodiments thereof, it will be apparent to one skilled in the art that various changes and modifications can be made therein without departing from the spirit and scope thereof.

What is claimed is:

1. A composition for making a lithographic printing plate capable of recording by imagewise exposure to light which contains a bismuth-germanium-sulfur series material containing at least 40 atomic % sulfur.

2. A composition for a recording material capable of recording by imagewise exposure to light, which includes as mandatory components Bi, Ge and S and which is represented by the following general formula:

$$Bi_XGe_YS_ZM_A$$

wherein $X+Y+Z=100$, X is less than 60 atomic %, Z is more than 40 atomic % and balance is Y to make 100 atomic %, $A \leq 10$, and M represents at least one element selected from the group consisting of selenium, tellurium, oxygen, phosphorus, sodium, potassium, silicon, tin, lead, zinc, iodine, copper, silver, gallium, indium, thallium, arsenic and antimony.

3. A composition as claimed in claim 2, which falls within the area bounded by the curve joining the points A, B, C, D, E and A in the FIGURE of the accompanying drawing or which lies on the curve joining the points D, E, A and B and which does not lie on the straight line joining the points B, C and D.

4. A composition as claimed in claim 2, which falls within the area bounded by the curve joining the points C, D, E and C in the FIGURE of the accompanying drawing or which lies on the curve joining the points D, E, and C and which does not lie on the straight line joining the points C and D.

5. A light-sensitive recording element for making a lithographic printing plate comprising a support having a layer thereon of the composition of claim 1.

6. A light-sensitive recording element comprising a support having a layer thereon of the composition of claim 2.

7. A process for forming a lithographic printing plate comprising image-wise exposing to light the light-sensitive recording element of claim 5, whereby an ink-repellant and an ink-receptive differentiation is produced between the exposed areas and the unexposed areas of said recording element.

8. The process of claim 7, further comprising the steps of applying a printing ink to the imagewise-exposed surface and transferring the ink by bringing said surface into contact with a second surface.

9. The light-sensitive recording element of claim 5, wherein the film thickness of said layer is about 25 Å to about 1,000μ.

10. The light-sensitive recording element of claim 9, wherein said thickness is about 100 Å to about 3,000 Å.

11. The light-sensitive recording element of claim 6, wherein the film thickness of said layer is about 25 Å to about 1,000μ.

12. The light-sensitive recording element of claim 11, wherein said thickness is about 100 Å to about 3,000 Å.

* * * * *